United States Patent [19]

Slay

[11] 4,238,736

[45] Dec. 9, 1980

[54] PEAK LIMITING BY HALF WAVES

[76] Inventor: Frederick M. Slay, 12425 Dancrest Dr., Clarksburg, Md. 20734

[21] Appl. No.: 927,276

[22] Filed: Jul. 24, 1978

[51] Int. Cl.³ .......................... H03K 5/08; H03L 5/00
[52] U.S. Cl. .................................... 328/169; 307/237; 307/264; 307/351; 328/54
[58] Field of Search ................. 328/54, 168, 169, 171, 328/173; 307/351, 237, 264

[56] References Cited

U.S. PATENT DOCUMENTS

| | | | |
|---|---|---|---|
| 3,611,383 | 10/1971 | Bar | 325/410 X |
| 3,652,944 | 3/1972 | Querry | 328/168 |
| 3,893,180 | 7/1975 | Braun et al. | 307/351 X |
| 4,069,452 | 1/1978 | Conway et al. | 307/351 X |

*Primary Examiner*—John Zazworsky

*Attorney, Agent, or Firm*—Nicholas J. Aquilino; James F. Cottone

[57] ABSTRACT

A method for accomplishing peak limiting of bipolar signal voltages wherein the signal is processed as a running series of half waves, each of which is individually examined and dynamically controlled in amplitude. A serially connected multiple section delay line technique is utilized to derive control signals for operating the amplitude control function. Illustrative apparatus for carrying out the method includes a thresholded light-dependent resistive attenuator controlled in part by a polarity sensitive zero-crossing detector. Also included are a number of serially connected delay stages, the output signals of which are polarity-sensed to form the bipolar signal being processed into the desired half wave sections, and are amplitude-sensed to provide the required amplitude control information.

10 Claims, 8 Drawing Figures

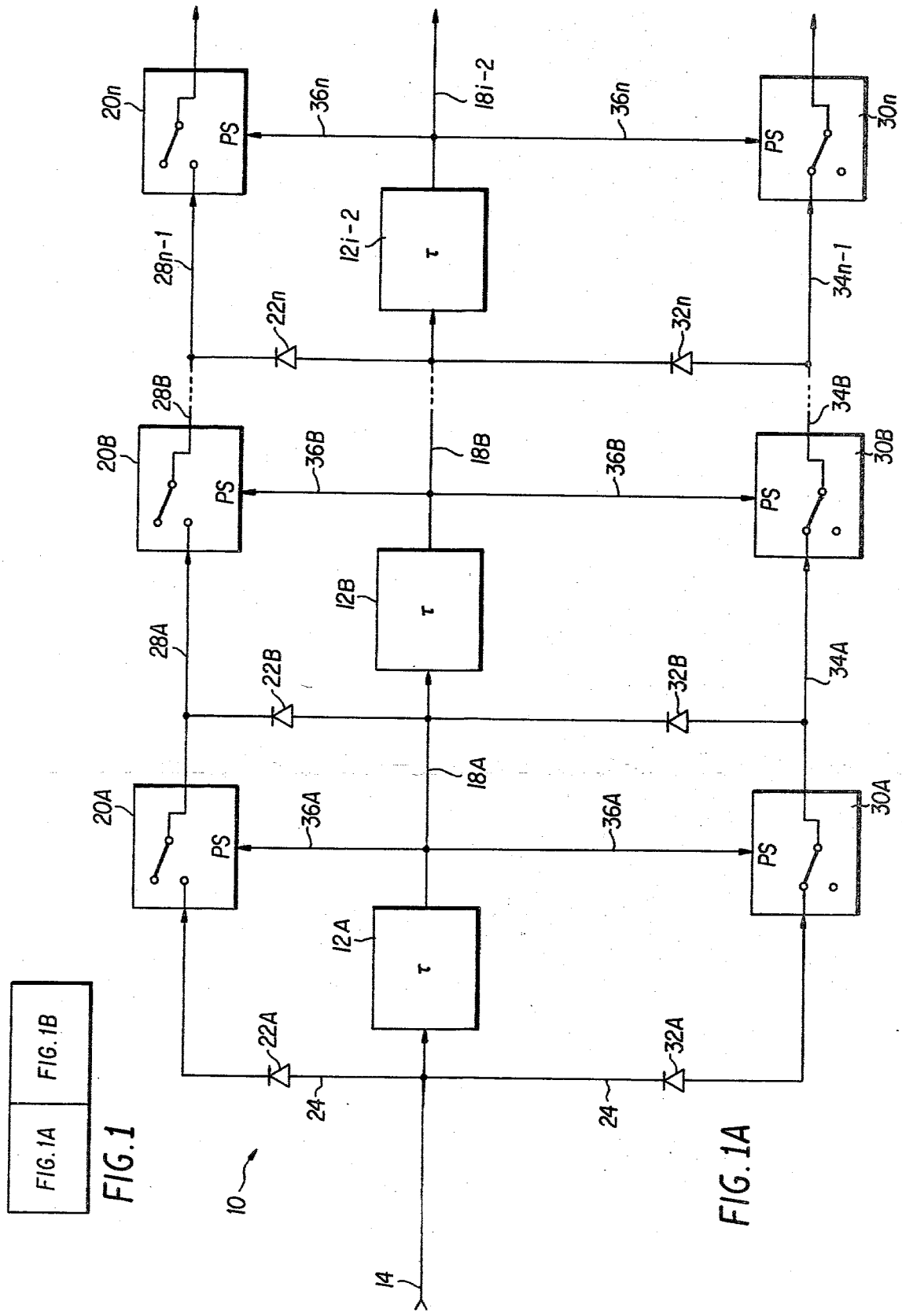

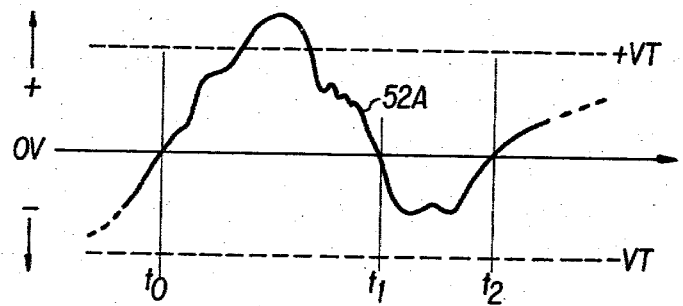
FIG. 2A
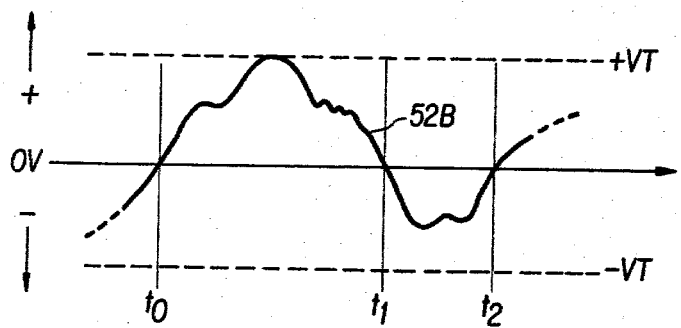
FIG. 2B
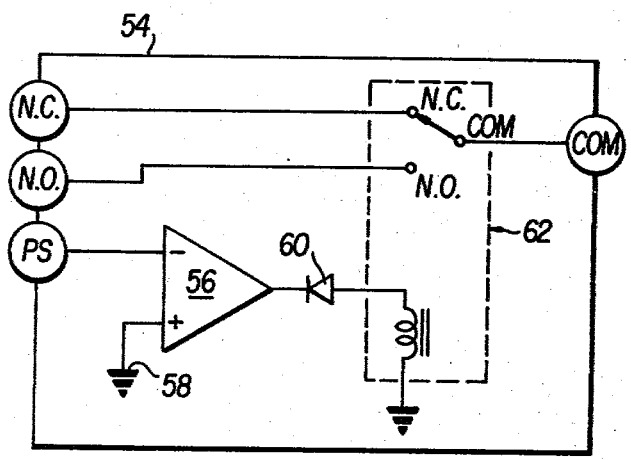
FIG. 3A
| (PS) | RELAY 62 | N.O. CONTACT | N.C. CONTACT |
|---|---|---|---|
| + VOLTAGE | ENERGIZED | COM | OPEN |
| − VOLTAGE | DE-ENERGIZED | OPEN | COM |
FIG. 3B

PEAK LIMITING BY HALF WAVES

BACKGROUND OF THE INVENTION

1. Field of the Invention

The present invention relates generally to the field of limiting the dynamic amplitude range of bipolar signal voltages and, more specifically, to peak limiting of these signals.

More particularly, the present invention relates to a method of and apparatus for maintaining the peak amplitude of a varying bipolar signal voltage below a predetermined threshold level. The method uses the technique of processing the signal voltages in discrete half-waves, and the apparatus uses a multiple section delay means.

2. Description of the Prior Art

Devices and techniques for limiting the dynamic range of signals are, of course, well known in the signal processing art and are typically needed to avoid exceeding the maximum allowable input signal voltage of one or more signal processing stages in a chain. Most conventionally, an amplifier having a logarithmic amplitude response, or a brute force hard limiter stage is used to keep the peaks of varying signal voltages from exceeding predetermined levels. Both of these methods have advantages of simplicity to offset, in part, the significant signal degradation they cause.

An ideal peak limiter would employ more graceful techniques. A significant improvement would employ an AGC type of action, which is only brought into play by some form of a priori knowledge of the signal amplitudes to be processed. Thus, an ideal AGC peak limiter would be kept out of the signal path when not needed, and would be inserted to perform a non-catastrophic peak signal limiting action only when needed. The prior art efforts to implement an approximation to this ideal peak limiter typically use a delay means of some form to introduce a delay into the signal channel while a parallel control channel makes some decisions as to the signal levels, etc. The control channel then begins to operate on the delayed signal as it emerges. U.S. Pat. No. 3,611,383 to Bar discloses a basic approach along these lines to operate on a unidirectional pulse of a Loran system to keep the received master and slave of sensibly constant amplitude and as free as possible from distortion. Of particular interest in Bar is the use of a delay line of predetermined, fixed delay time corresponding to the known pulse durations and interpulse intervals. The technique is obviously applicable only when the incoming signal has very well known time characteristics. U.S. Pat. No. 3,652,944 to Querry also discloses a delay line/AGC technique for normalizing the amplitudes of undirectional pulse trains. While the prior art teachings of peak limiting of varying signal voltages show that a good deal of effort has been directed to the problem, it is clear that there is significant room for improved techniques, especially in the areas of peak limiting of bipolar signal voltages having wide frequency and amplitude dynamic ranges.

SUMMARY OF THE INVENTION

Therefore, it is a primary object of the present invention to provide improved methods and apparatus for peak limiting of bipolar signals having the most generalized characteristics.

The method taught herein uses the technique of dividing up the signal being peak limited into a running series of half waves and providing gain control only for those half waves containing peaks which would have exceeded a preset threshold level. The gain control in fact reduces the amplitude of an entire half wave having a threshold exceeding peak within it such that the highest peak value within the half wave is brought down to be just equal to the threshold level. To accomplish this action, an illustrative apparatus uses a signal delay channel formed from a number of delay stages wherein the output of each delay stage is processed to produce the half wave information and to further produce the highest peak value within each half wave.

A further object of the present invention is to provide a peak limiting system which operates on signal voltages of alternating polarities (bipolar signals) and which passes undisturbed those signal levels contained within a particular half wave which do not exceed a predetermined threshold level.

A further object of the present invention is to provide a peak signal limiter which operates on bipolar signals and absolutely precludes an output signal from exceeding a preset threshold level, without the use of hard limiting.

Another object of the present invention is to provide a method of peak limiting bipolar signals which functions by identifying where potentially offending peak valves exist in a signal train, and then providing amplitude correction only to a portion of the signal train containing the potentially offending peak.

Another object of the present invention is to provide a peak signal limiter circuit employing a multiple section delay line where at least one half wave of the incoming signal voltage is spatially distributed within the delay line so as to correspond to a temporal distribution of the incoming signal voltage.

BRIEF DESCRIPTION OF THE DRAWINGS

Additional objects and advantages of the present invention will become apparent to those skilled in the art as the description proceeds with reference to the accompanying drawings wherein:

FIGS. 1A and 1B form an overall block diagram of an illustrative embodiment of the half wave peak limiter of the present invention.

FIGS. 2A and 2B show the action of the method of the present invention on a typical bipolar audio waveform.

FIG. 3A is a schematic diagram of a polarity sensitive switching circuit, in simplified form.

FIG. 3B is a logic table showing the action of the circuit of FIG. 3A.

DETAILED DESCRIPTION OF THE PREFERRED EMBODIMENT

Figure 1B:
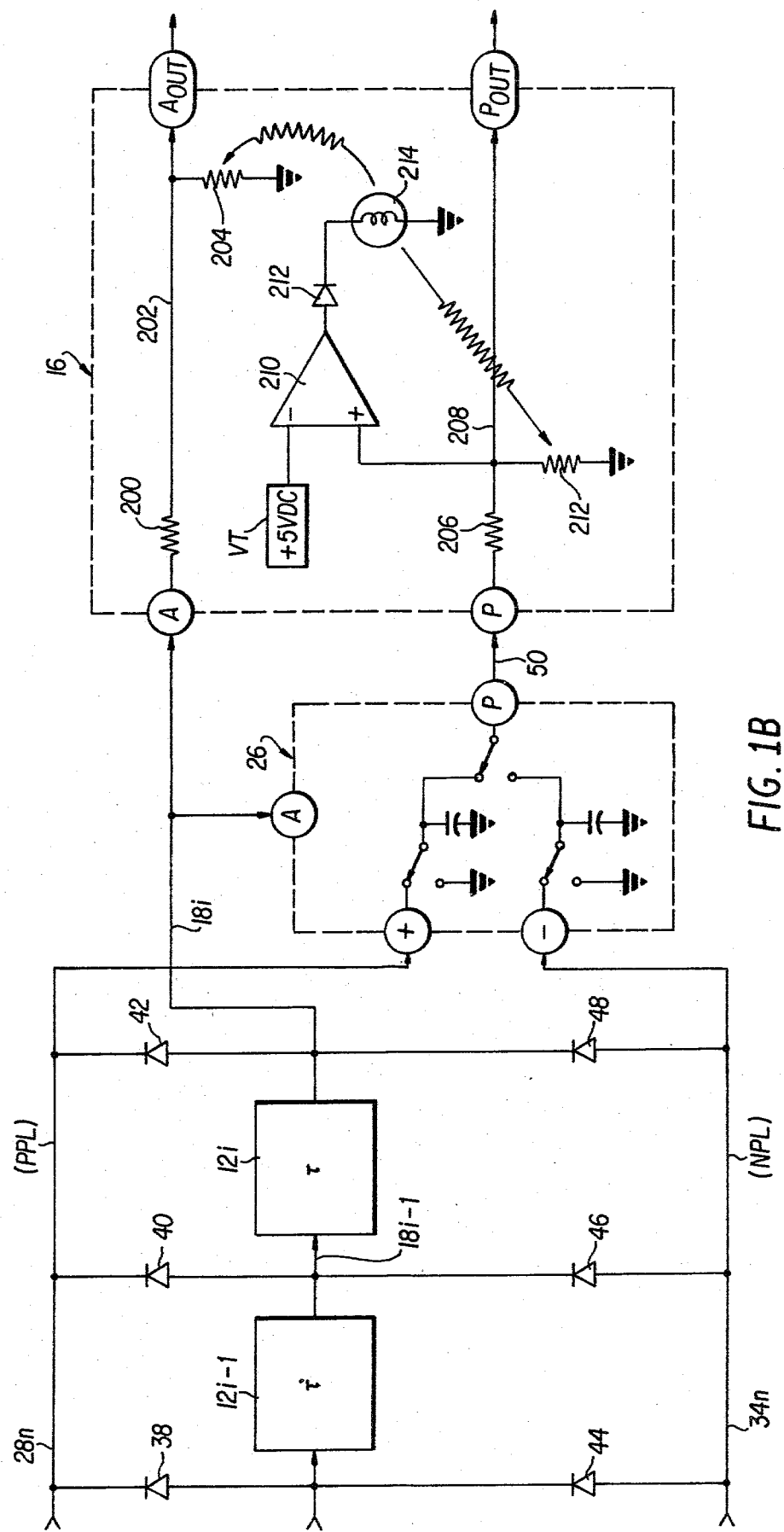

Referring now to FIG. 1 (made up of FIGS. 1A and 1B), there is shown an overall block diagram of the half wave peak limiter system of the present invention. The overall system 10 has a plurality of identical delay stages 12A to 12$i$ serially disposed between an input port 14 and a first input (A) of a gain set circuit 16. Each of the delay stages 12A−12$i$ introduces a discrete time delay $\gamma$ into the timing of the signals applied to it. The output of each of the delay stages 12A to 12$i$−1 is routed to the input of the successive delay stage via a plurality of lines 18A to 18$i$−1, and the output of the delay stage 12*i* is routed via a line 18*i* to the aforementioned first input (A). The input signal to the system 10 is routed directly from the input port 14 to the first delay stage 12A. The output signal from the system, after it has been processed by the method of half wave peak limiting, is routed via a first output (Aout) of the gain set circuit 16.

A first plurality of identical switching circuits 20A to 20*n* are serially disposed between a diode 22A, connected to the input port 14 via a sensing line 24, and a first input (+) of a zero-crossing switching circuit 26. The zero-crossing switching circuit 26 will hereinafter be referred to as the ZCS 26. The output of each of the switching circuits 20A to 20*n*−1 is routed to the input of the successive switching circuit via a plurality of lines 28A to 28*n*−1, and the output of switching circuit 20*n* is routed via a line 28*n* to the input (+) of the ZCS 26. A second plurality of identical switching circuits 30A to 30*n* are serially disposed between a diode 32A, connected to the input port 14 via the sensing line 24, and a second input (−) of the ZCS 26. The output of each of the switching circuits 30A to 30*n*−1 is routed to the input of the successive switching circuit via a plurality of lines 34A to 34*n*−1, and the output of switching circuit 30*n* is routed via a line 34*n* to the input (−) of the ZCS 26. The two group of switching circuits (20A to 20*n*, and 30A to 30*n*) are equal in number to the group of switching circuits 30A to 30*n*, and all the individual switching circuits (20A to 20*n* plus 30A to 30*n*) are identical both as to structure and function. Each of the switching circuits in the groups 20A to 20*n* and 30A to 30*n* have a separate polarity sensing input (PS) energized by a plurality of lines 36A to 36*n*, wherein the identifying letters A to n correspond to the particular switching circuits with which it is associated. For example, sensing lines 36A provides the output of delay stage 12A to the (PS) input of the switching circuits 20A and 30A. Also, each of the switching circuits in the groups 20A to 20*n* and 30A to 30*n* have separate magnitude sensing inputs energized by a plurality of appropriately paled diodes 22A to 22*n* and 32A to 32*n*, wherein the identifying letters A to *n* correspond to the particular two switching circuits with which the diode is associated. Thus, diode 22B has its cathode connected to the magnitude sensing input of switching circuit 20B, via the line 28A, and its anode connected to the output of delay circuit 12A via the line 18A. Conversely, the diode 32B has its anode connected to the magnitude sensing input of switching circuit 30B via the line 34A, and its cathode connected to the output of delay circuit 12A also via the line 18B.

A plurality of diodes 38, 40 and 42 have their cathodes connected to the line 28*n*, and have their anodes connected as follows. The anode of diode 38 is connected to the output of delay stage 12*i*−2, the anode of diode 40 is connected to the output of delay stage 12*i*−1, and the anode of diode 42 is connected to the output of the (ith and final) delay stage 12*i*. A plurality of diodes 44, 46 and 48 have their anodes tied together and connected to the line 34*n*, and have their cathodes connected as follows. The cathode of diode 44 is connected to the output of delay stage 12*i*−2, the cathode of diode 46 is connected to the output of delay stage 12*i*−1, and the cathode of diode 48 is connected to the output of the (ith and final) delay stage 12*i*. The diode 38, 40 and 42 are poled identically to the diodes 22A to 22*n*; and the diodes 44, 46 and 48 are poled identically to the diodes 32A to 32*n*. A third input to the ZCS 26 is routed from the output of delay stage 12*i* via the line 18*i* to an (A) input of ZCS 26. The specific circuitry within the ACS 26 may be disregarded for the present. A more detailed version is described later in connection with FIG. 4. An output (P) of the ZCS 26 is routed via a line 50 to a second input (P) of the gain set circuit 16. A second output of the gain set circuit 16 is designated as (Pout).

An overview of the functioning of the overall system 10 is facilitated with continued reference to FIG. 1. Briefly, the bipolar signal which is to peak limited is applied to the input port 14; is then passed through the cascaded delayed stages; and emerges on the line 18*i* at the input (A) of the gain set circuit 16 delayed in time by the cummulative delay times of delay stages 12A to 12*i*. At this point, the signal being processed is delayed in time only, and may exhibit the same amplitude at input (A) as existed at input port 14. The dynamic amplitude range and frequency content of the input signal, however, are preserved.

The delayed signal is applied to the gain set circuit 16 which establishes the gain (or loss) to be applied to the signal in accordance with two key pieces of information such that the delayed signal emerges from the (Aout) terminal peak limited by the method of the instant invention. The two key pieces of information are - knowledge of the peak amplitude both of the positive and negative peaks extant within the delay stages 12A to 12*i*; and knowledge of the zero-crossing times, and polarities of the signals so as to exert a pseudo "a priori" switching action to control the gain of the gain set circuit 16. As will be described below, the gain set circuit 16 is capable of setting its gain smoothly over a range of levels, and that a particular gain level, once set by the circuitry, remains at that set level for the duration of the half wave being processed. Thus, the three functional entities—the cascaded delay stages, the zero-crossing sensing, and the gain set circuitry, all cooperate to achieve the desired limiting action wherein the peak amplitudes of an input signal which exceed a predetermined threshold level are limited by controllably reducing the amplitude of the entire half wave encompassing the offending peaks.

Prior to proceeding with a detailed description of the illustrative circuitry used to implement the peak limiting method of the invention, it is helpful to clarify the sense in which the term "half wave" is used herein. This is best done by considering the simplified waveforms of FIGS. 2A and 2B. Fig. 2A shows a short time section of a conventional bipolar (audio illustratively) waveform 52A on voltage/time axis, where the times t0, t1, and t2 indicate the point on the waveform 52A where zero-crossings occur. Both t0 and t2 are positive going, while t1 is negative going. The signal interval between t0 and t1, and the signal interval between t1 and t2, are each considered half waves. The half waves may be of any duration and are defined only by intervals between opposite going zero axis crossings. Positive and negative voltages thresholds, of +VT and −VT, respectively, are shown by means of dashed lines and it is seen that the waveform 52A exceeds the positive threshold for a time within the interval between t0 and t1. The waveform 52B of FIG. 2B shows the same time section as waveform 52A, after its having been processed by the method disclosed herein. Note that the entire positive half wave of waveform 52B has been reduced in amplitude such that its peak value is now just equal to the positive threshold +VT, and that the negative half wave has been passed undisturbed. In a nutshell, the waveforms of FIGS. 2A and 2B illustrate the results of the method taught in the present invention.

Referring now to FIG. 3A there is shown a schematic diagram of a polarity sensitive switching circuit 54 used to perform the switching functions of switching circuits 20A to 20n, and 30A to 30n of FIG. 1. For clarity of description, the circuitry is shown in idealized, simplified form.

An operational amplifier (op amp) 56 powered by a bipolar power supply (not shown) has its inverting input node connected to a system ground 58, and its non-inverting input node connected to a polarity sensing input terminal (PS). The output of op amp 56 is routed to the cathode of a diode 60 whose anode is in turn routed to one end of a coil of a relay 62. The other end of the coil is grounded, and the relay 62 has single-pole-double-throw contacts conventionally designated for its normally open (NO), normally closed (NC), and its movable (COM) contacts. In operation, the switching circuit 54 senses the polarity of the voltage applied to its input terminal (PS) and energizes the relay 62 in response to the logical conditions as follows. When the (PS) input senses a negative voltage, the output of op amp 56 becomes positive, reversely biasing the diode 60 and maintaining the relay 62 in its deenergized condition—as shown. Relay contact COM remains connected to the NC contact. When the PS input senses a positive applied voltage (however slight), the relay 62 is energized causing the COM contact to transition to the NO position. The logical switching action of switching circuit 54 is summarized in FIG. 3B. The circuitry described represents the most conceptionally straight-forward embodiment sufficient to accomplish the logical switching action desired, and is described in terms of ideal components, such as ideal diodes, ideal op amps, and so forth. In actual practice, the circuit may be implemented by equivalent but different means, and hence would likely comprise solid-state switching devices in lieu of relays (for higher speed switching action) and the use of differential comparator circuitry using LSI technology in lieu of the discrete op amp shown.

Referring momentarily to FIG. 1, in addition to FIG. 3A, it will be seen that the switching circuits 20A to 20n are wired such that only the COM and NO portions of relay 62 are used. That is, only a single-pole-single-throw capability of the relay 62 contacts are used, and for the cascaded arrangement shown, a continuous bus may be formed. Therefore, switching circuits 20A to 20n serve to provide a continuous bus including those segments of the lines 28A to 28n where the polarity sensing inputs (PS), as applied via the lines 36A to 36n, are providing a positive input voltage. For that portion of the lines 28A to 28n which is thus formed into a bus, the instantaneous positive voltages present at the inputs to the particular delay stages involved, are connected via the appropriate isolating diodes (from the group containing 22A to 22n) to provide a positive peak line (PPL). This (PPL) is depicted for operational reasons as being the same as line 28n. Present on the (PPL) is the highest positive signal voltage existing at the input of any delay stage anywhere within the formed bus. Due to the fact that the input signal is being propagated through the delay stages 12A to 12i, progressively to the right, the portion of the bus formed as described above is also moving to the right and ultimately arrives at the input (+) of the ZCS 26 as will be described hereinbelow. This action, in effect, produces a bus for a "half wave" which when considered over any moderately long time interval, gives rise to a running series of half waves.

In a similar manner, a negative peak line (NPL) is created (depicted for operational reasons as being the same as the line 34n) and is propagated to the right to ultimately arrive at the input (−) of the ZCS 26. This is accomplished by action of the switching circuits 30A to 30n which are wired such that only the COM and NC contacts of relay 62 are used. Therefore, switching circuits 30A to 30n serve to provide a continuous bus for those segments of the lines 34A to 34n, where the polarity sensing inputs (PS), also as applied by the lines 36A to 36n, are providing a negative input voltage. For that portion of the lines 34A to 34n which is thus formed into a bus, the instantaneous negative voltages present at the inputs to the particular delay stages involved, are connected via the appropriate isolated diodes (from the group 32A to 32n) to provide the (NPL). Present on the (NPL) is the highest negative signal voltage existing at the input of any delay stage anywhere within the formed bus.

Figure 4:
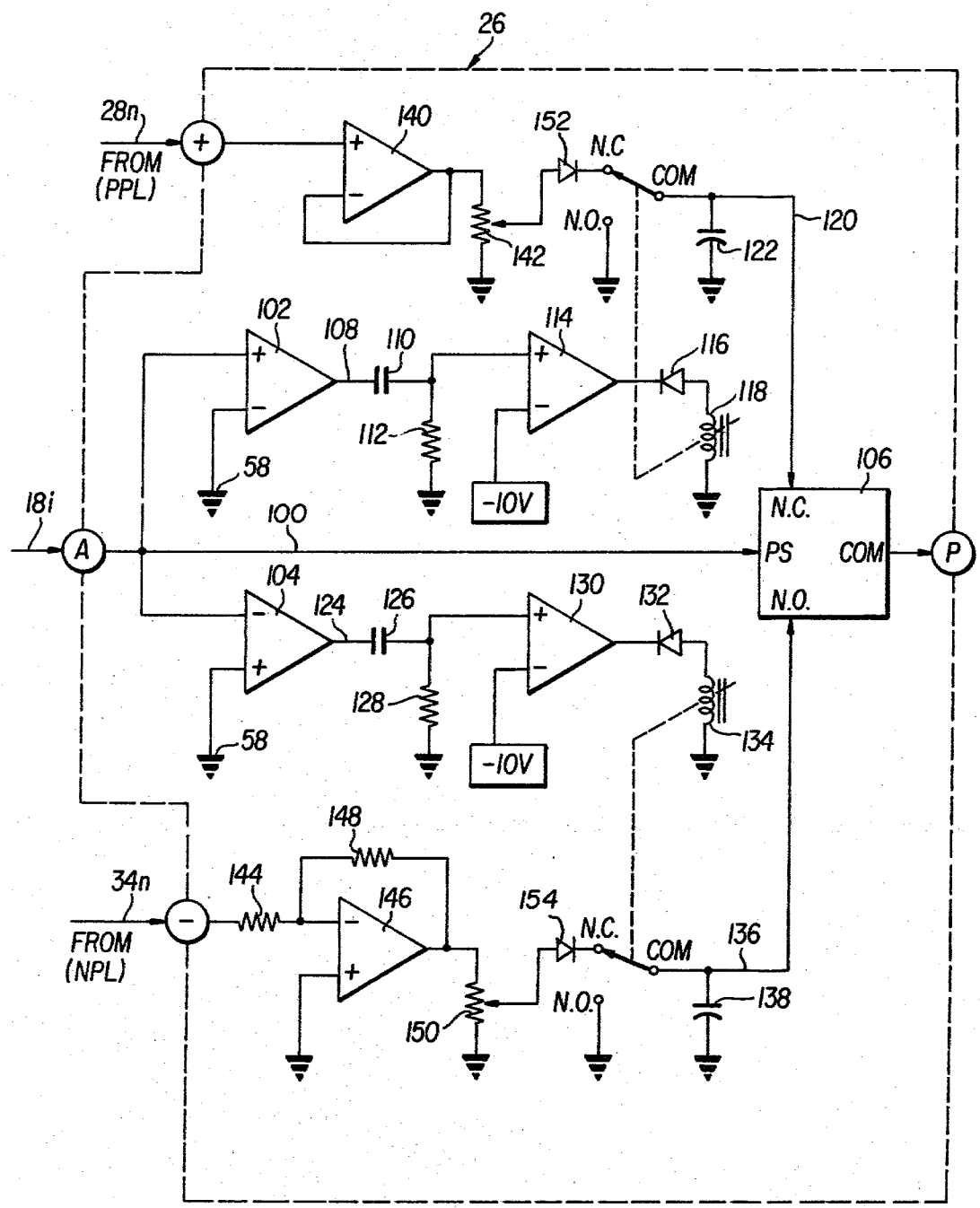
FIG. 4 is a schematic diagram of a zero-crossing detector circuit, in simplified form.

Referring now to FIG. 4, there is shown a schematic diagram of the ZCS 26. The delayed signal from the delay stages 12A to 12i (on the line 18i) is routed from the input terminal (A) via a line 100 to a non-inverting input of an op amp 102, and to an inverting input of an op amp 104, and further to a (PS) input of a polarity sensing switching circuit 106. Switching circuit 106 is identical in structure and function to the switching circuit 54 described in connection with FIG. 3A, and is also identical to the switching circuits 20A to 20n and 30A to 30n of FIG. 1. An inverting input of op amp 102 and a non-inverting input of op amp 104 are connected to system ground 58. The output of op amp 102 is routed via a line 108 to a first end of a capacitor 110. The other end of capacitor 110 is connected both to a resistor 112, whose other end is grounded, and to a non-inverting input of an op amp 114. An inverting input of op amp 114 is routed to a predetermined negative reference voltage, designated −10 V. The output of op amp 114 is routed to the cathode of a diode 116, whose anode is in turn routed to one end of a coil of a relay 118. The other end of the coil is grounded, and the relay 118 has single-pole-double-throw contacts designated conventionally as its normally open (NO) normally closed (NC), and its movable (COM) contacts. The NO contact of relay 118 is grounded, and the COM contact of relay 118 is routed via a line 120 to a first end of a capacitor 122 whose other end is grounded, and to an NC input of switching circuit 106.

The output of op amp 104 is routed via a line 124 to a first end of a capacitor 126. The other end of capacitor 126 is connected both to a resistor 128, whose other end is grounded, and to a non-inverting input of an op amp 130. An inverting input of op amp 130 is routed to a predetermined negative reference voltage, designated −10V. The output of op amp 130 is routed to the cathode of a diode 132 whose anode is in turn routed to one end of a coil of a relay 134. The other end of the coil is grounded, and the relay 134 also has single-pole-double-throw contacts designated conventionally as its normally open (NO), normally closed (NC), and its movable COM contacts of relay 134 is routed via a line 136 to a first end of a capacitor 138 whose other end is grounded, and to an NO input of switching circuit 106.

The peak positive signal voltage from the (PPL) is routed (from the line 28n) via input terminal (+) to a non-inverting input of an op amp 140. Op amp 140 has its output strapped back to its inverting input to implement a voltage follower. The output of op amp 140 also is routed to a variable resistor 142 having one end grounded and its wiper arm connected to the anode of diode 152 whose cathode is in turn connected to the NC contact of relay 118. The peak negative signal voltage from the (NPL) line, is routed (from the line 34n) via input terminal (−) through a first resistor 144 to an inverting input of an op amp 146. A non-inverting input of op amp 146 is grounded, and the output of op amp 146 is strapped back to its inverting input via a resistor 148. The output of op amp 146 is routed to a variable resistor 150 having one end grounded and its wiper arm is connected to the anode of diode 154 whose cathode is in turn connected to the NC contact of relay 134.

The circuitry associated with op amps 102 and 114 is used to detect negative-going zero-crossings in the delayed signal at the input terminal (A) and to momentarily actuate relay 118 on detecting that specific transition. Similarly, the circuitry associated with op amps 104 and 130 is used to detect positive-going zero-crossings in the delayed signal at the input terminal (A) and to momentarily actuate relay 134 on detecting that specific transition. Op amps 140 and 146 provide, respectively, the peak positive and peak negative voltage values to the appropriate contacts of relays 118 and 134, and subsequently, to the output terminal (P) via the switching circuit 106.

The circuitry comprising op amps 102 and 114, and relay 118, senses negative-going zero-crossings in the delayed signal by virtue of the combination of AC coupling between op amps 102 and 114, and the negative threshold voltage −10 V applied to op amp 114. As the output of op amp 102 is AC coupled to the non-inverting input of op amp 114 using short time constants for resistors 112 and capacitor 110, any output of op amp 102 will only be coupled to op amp 114 for a comparatively short duration. Any input voltage to the inverting input of op amp 114 is ineffective unless it is negative and is greater in magnitude than −10 V, thus the normal (non-actuated) stage of op amp 114 is such that the −10 V applied to the inverting input causes its output to be +15 V (+ and −15 V supply voltages to all op amps is illustratively assumed). This positive output voltage back biases the diode 116 causing relay 118 to be deenergized. When a negative-going zero-crossing is applied to the non-inverting input of op amp 102, its output transitions abruptly from +15 V (where it was during the time when the input was positive, i.e. just prior to the negative-going zero-crossing) to −15 V. This abrupt negative 30-volt transition is AC coupled to the non-inverting op amp 114 and persists for a period, during which time it overcomes the −10 V bias applied to the inverting input. For this short time, relay 118 is momentarily energized which serves to discharge the positive peak voltage via the NO contact of relay 118 stored on the capacitor 122. The capacitor 122 is then reconnected to the NC terminal to await the next positive half wave peak voltage value for processing.

In the absence of a negative-going transition, the relay 118 is deenergized; the voltage on capacitor 122 represents the (PPL) value; and hence, the peak positive voltage on the (+) terminal is coupled via the NC and COM contacts of relay 118 to the NC input of switching circuit 106. The action of switching circuit 106, as summarized in FIG. 3B, shows that for the condition wherein the signal voltage on terminal (PS) is positive, its NO/COM contact are connected. Therefore, when a positive half wave signal is emerging from the delay stages 12A to 12i, and being applied to the (A) input of the ZCS 26 (and, of course, to the (PS) input of switching circuit 106) —and a negative-going zero-crossing has not most recently occurred; the most positive peak voltage for the entire positive half wave is applied via the (P) terminal of the ZCS 26 to the gain set circuit 16, as shown in FIG. 1.

The circuitry comprising op amps 104 and 130, and the relay 134, senses positive-going zero-crossings in the delayed signal and functions similarly to that just described, the only difference being the polarity of the zero-crossing operated on.

Thus, it is seen that ZCS 26 provides the two key pieces of information—peak amplitude for each half wave extant, and synchronized zero-crossing signals—required for carrying out the method of the present invention.

Referring now to FIG. 1, the structure and operation of gain set circuit 16 is detailed. The delayed output signal from the delay stages 12A to 12i is routed from the input terminal (A) to a fixed resistor 200 and thereafter, via a line 202 to one end of a light dependent resistor (hereinafter LDR) 204. The other end of LDR 204 is grounded thereby forming, in combination with resistor 200, an L-section resistive attenuator. The output of the resistive attenuator is routed via the line 202 to the system output terminal (Aout). The output control voltage from the (P) terminal of the ZCS 26 is routed via the line 50 to a (P) input terminal, and thereafter to a first end of a fixed resistor 206. The other end of the resistor 206 is routed via a line 208 to an output terminal (Pout); to a non-inverting input of an op amp 210; and to a first end of a light dependent resistor (LDR) 212, whose other end is grounded. A predetermined DC threshold voltage, designated VT, is applied to an inverting input of op amp 210. This threshold voltage VT is the same potential shown in FIGS. 2A and 2B as +VT and −VT. The output of op amp 210 is routed to an anode of a diode 212, whose cathode is in turn routed to a first end of a lamp 214, the other end of which is grounded. The lamp 214 may be formed into a single complimentary assembly along with the two LDRs 204 and 212, whose resistances it controls. In actual operation, the signal to be peak limited is applied to the input terminal (A) of gain set circuit 16; is dynamically attenuated by the action of resistor 200 and the LDR 204; and emerges at the (Aout) terminal. The dynamic attenuator is controlled by the rest of the circuitry of the gain set circuit 16 acting on the voltage (which can only be a positive voltage) supplied to its (P) terminal. The illustrative embodiment of the gain set circuit 16 may be configured as follows. The resistors 200 and 206 are of equal value; the LDRs 204 and 212 are a matched pair having infinite resistance when in total darkness; the op amp 210 is powered by + and −15 VDC; the threshold voltage VT is established at +5 VDC; and as before, for simplicity of explanation, all circuit elements are ideal. When the control voltage at (P) is less than +5 V, the output of op amp 210 would be −15 VDC, which back biases the diode 212 causing the lamp 214 to be extinguished. Therefore, the LDR 204 will exhibit an open circuit and the full signal applied to the input terminal (A) will be routed directly to the output terminal (Aout). When the control voltage at (P) becomes greater than +5 V, the output of op amp 210 will try to transition to +15 VDC, but this will cause the lamp 214 to light which will reduce the resistance of LDR 212, and hence limit the greater than +5 V at the (P) terminal to a lesser value at the non-inverting input of op amp 210. The circuitry actually reaches an equilibrium point when a voltage at (Pout) approaches +5 V to balance the threshold voltage of VT of +5 V. At this time, the gain (actually attenuation) of the resistor 206/LDR 212 combination is such that the peak voltage present on either the (PPL) or (NPL) is reduced so as to make the peak voltage at the (Pout) terminal equal to the voltage threshold VT. Simultaneously, the gain of the resistor 200/LDR 204 combination is acting on the delayed signal waveform, as it emerges from the delay stages 12A to 12i and becomes present at the (A) terminal, so as to keep the highest peak voltage within the particular half wave being processing just equal to the voltage threshold VT. It should be noted that the gain is set only once for a particular half wave being processed and remains constant for the full duration of that half wave. Thus, the peak limiting of bipolar signals having a large dynamic amplitude range is accomplished by the method of half waves, according to the present invention.

Although the invention has been described in terms of an illustrative embodiment used to implement the method of half wave limiting taught herein, the invention should not be deemed limited thereto since other embodiments and modifications will readily occur to one skilled in the art. It is, therefore, to be understood that the appended claims are intended to cover all such embodiments and modifications as fall within the true spirit and scope of the invention.

What is claimed is:

1. A method of maintaining the peak amplitude of a varying bipolar voltage signal below a predetermined level comprising the steps of:
    (a) electronically delaying said voltage signal and processing selected portions of said voltage signal as a half wave defined by an interval between opposite-going adjacent zero axis crossings of said voltage signal;
    (b) electronically comparing the highest peak amplitude within each half wave to said predetermined level to derive an amplitude control signal; and
    (c) using said control signal for establishing the amplitude of each half wave on an individual basis such that no portion of said voltage signal exceeds said predetermined level.

2. The method as recited in claim 1 wherein said delaying and processing step further includes the step of delaying said signal voltage via a plurality of serial delay means and sensing the polarity of said voltage signal at the output of selected ones of said plurality of delay means.

3. The method as recited in claim 2 wherein said amplitude establishing step is accomplished on each individual half wave using a fixed control signal value for each individual half wave.

4. The method as recited in claim 3 wherein said comparing step is accomplished on the individual half wave which has undergone the longest electronic delay and includes portions which are still being delayed.

5. The method as recited in claim 4 wherein said amplitude establishing step is accomplished in part by applying a lamp intensity signal to light dependent amplitude controlling means.

6. A peak amplitude limiting unit for maintaining the amplitude of a varying bipolar voltage below a threshold level, comprising:
    (a) serially-connected multiple discrete section delay means for delaying said bipolar voltage via discrete delay intervals corresponding to said sections wherein said delay means have a tap at the output of each discrete section;
    (b) means for detecting the times at which said bipolar voltage changes polarity and for detecting the polarity of said bipolar voltage in connection with said polarity change detections;
    (c) half wave forming means comprising polarity sensitive switching means associated with a substantial majority of said delay means taps; and
    (d) a dynamic amplitude controlling circuit having a comparator referenced to said threshold level for determining the relative magntidues of said bipolar voltage and said threshold level and for producing a control signal to maintain said bipolar voltage below said threshold level.

7. The peak amplitude limiting unit of claim 6 wherein said amplitude controlling circuit comprises an attenuator.

8. The peak amplitude limiting unit of claim 7 wherein said attenuator is comprised of at least one light sensitive impedance element.

9. The peak amplitude limiting unit of claim 8 wherein said control signal is a light intensity corresponding to said relative magnitudes.

10. A peak amplitude limiting unit as recited in claim 9 wherein the delay interval corresponding to each of said discrete section delay means is at least as long as the period of a half wave at the highest frequency to be processed in said bipolar voltage, and the total delay interval corresponding to the serially connected multiple discrete delay means is at least as long as the period of the half wave at the lowest frequency to be processed in said bipolar voltage.

* * * * *